(12) United States Patent
Wang et al.

(10) Patent No.: US 10,108,837 B2
(45) Date of Patent: Oct. 23, 2018

(54) FINGERPRINT RECOGNITION CHIP PACKAGING STRUCTURE AND PACKAGING METHOD

(71) Applicant: China Wafer Level CSP Co., Ltd., Suzhou (CN)

(72) Inventors: Zhiqi Wang, Suzhou (CN); Qiong Yu, Suzhou (CN); Wei Wang, Suzhou (CN)

(73) Assignee: China Wafer Level CSP Co., Ltd., Suzhou, Jiangsu (CN)

( * ) Notice: Subject to any disclaimer, the term of this patent is extended or adjusted under 35 U.S.C. 154(b) by 18 days.

(21) Appl. No.: 15/322,080

(22) PCT Filed: Jun. 30, 2015

(86) PCT No.: PCT/CN2015/082717
§ 371 (c)(1),
(2) Date: Dec. 23, 2016

(87) PCT Pub. No.: WO2016/000598
PCT Pub. Date: Jan. 7, 2016

(65) Prior Publication Data
US 2017/0147851 A1 May 25, 2017

(30) Foreign Application Priority Data
Jul. 1, 2014 (CN) .......................... 2014 1 0310106

(51) Int. Cl.
*G06K 9/28* (2006.01)
*G06K 9/00* (2006.01)
(Continued)

(52) U.S. Cl.
CPC ........... *G06K 9/0002* (2013.01); *G06K 9/001* (2013.01); *G06K 9/00087* (2013.01);
(Continued)

(58) Field of Classification Search
CPC ...... G06K 9/00013–2009/0006; G06K 9/0002
See application file for complete search history.

(56) References Cited

U.S. PATENT DOCUMENTS

2006/0034499 A1* 2/2006 Shinoda ............ G06K 9/00013
382/124
2008/0157357 A1 7/2008 Kim et al.
(Continued)

FOREIGN PATENT DOCUMENTS

CN 1694260 A 11/2005
CN 101197382 A 6/2008
(Continued)

OTHER PUBLICATIONS

International Search Report for International Application No. PCT/CN2015/082717 dated Sep. 25, 2015.
(Continued)

*Primary Examiner* — Brian Werner
(74) *Attorney, Agent, or Firm* — Wolf, Greenfield & Sacks, P.C.

(57) ABSTRACT

A fingerprint recognition chip packaging structure and a packaging method. The packaging structure includes: a substrate, which is provided with a substrate surface; a sensor chip coupled on the surface of the substrate, where the sensor chip is provided with a first surface and a second surface opposite the first surface, the first surface of the sensor chip is provided with a sensing area, and the second surface of the sensor chip is arranged on the surface of the substrate; and, a lamination layer arranged on the surface of the substrate and on the surface of the sensor chip, where the lamination layer covers the surface of the sensing area of the sensor chip, a portion of the lamination layer located at the surface of the sensing area is of a preset thickness, and the material of the lamination layer is a polymer.

19 Claims, 4 Drawing Sheets

(51) Int. Cl.
*H01L 23/31* (2006.01)
*H01L 21/56* (2006.01)
*H01L 23/60* (2006.01)
*H01L 23/00* (2006.01)

(52) U.S. Cl.
CPC .............. *H01L 21/56* (2013.01); *H01L 23/31* (2013.01); *H01L 23/3121* (2013.01); *H01L 23/60* (2013.01); *H01L 24/49* (2013.01); *H01L 24/48* (2013.01); *H01L 2224/45124* (2013.01); *H01L 2224/45139* (2013.01); *H01L 2224/45144* (2013.01); *H01L 2224/45147* (2013.01); *H01L 2224/45184* (2013.01); *H01L 2224/48091* (2013.01); *H01L 2224/73265* (2013.01)

(56) References Cited

U.S. PATENT DOCUMENTS

| | | |
|---|---|---|
| 2009/0283845 A1 | 11/2009 | Chou |
| 2011/0278724 A1 | 11/2011 | Lin et al. |
| 2011/0309482 A1 | 12/2011 | Salatino et al. |
| 2014/0140588 A1* | 5/2014 | Chou .................... G06K 9/0002 382/124 |
| 2015/0028465 A1* | 1/2015 | Itoh ......................... H01L 24/48 257/676 |
| 2016/0335468 A1* | 11/2016 | Long .................... G06K 9/0002 |

FOREIGN PATENT DOCUMENTS

| | | |
|---|---|---|
| CN | 102244047 A | 11/2011 |
| CN | 103038782 A | 4/2013 |
| CN | 103793689 A | 5/2014 |
| CN | 104051368 A | 9/2014 |
| CN | 204029789 U | 12/2014 |
| KR | 10-2008-0062577 A | 7/2008 |
| KR | 10-2013-0043161 A | 4/2013 |
| TW | 201140779 A | 11/2011 |
| TW | 201421021 A | 6/2014 |
| WO | WO 2013/172609 A1 | 11/2013 |

OTHER PUBLICATIONS

Taiwanese 1st Office Action for Application No. TW 104120854 dated May 6, 2016.
Korean Office Communication for Application No. 10-2017-7001840 dated Dec. 15, 2017.

* cited by examiner

FINGERPRINT RECOGNITION CHIP PACKAGING STRUCTURE AND PACKAGING METHOD

CROSS-REFERENCE TO RELATED APPLICATIONS

This application is a national phase of International Application No. PCT/CN2015/082717, titled "FINGERPRINT RECOGNITION CHIP PACKAGING STRUCTURE AND PACKAGING METHOD", filed on Jun. 30, 2015, which claims priority to Chinese Patent Application No. 201410310106.1, titled "FINGERPRINT RECOGNITION CHIP PACKAGING STRUCTURE AND PACKAGING METHOD", filed on Jul. 1, 2014 with the State Intellectual Property Office of the People's Republic of China, both of which applications are incorporated herein by reference in their entireties.

TECHNICAL FIELD

The present disclosure relates to the technical field of semiconductor manufacture, and in particular to a package structure and a packaging method for a fingerprint recognition chip.

BACKGROUND

With the progress of modern society, attention on significance of personal identity identification and personal information security is gradually increasing. Due to uniqueness and invariance of human fingerprints, fingerprint recognition technology has high security and high reliability, and is simple and convenient to use. As a result, fingerprint recognition technology is widely applied to various fields of personal information security protection. With the continuous developments in science and technology, information security problem of various electronic products is always one of the focus points in technology development. Especially for mobile terminals such as mobile phone, laptop computer, tablet computer and digital camera, a requirement for information security is more urgent.

A conventional fingerprint recognition device may implement sensing in a capacitive (electrical field) manner or in an inductive manner. The fingerprint recognition device obtains fingerprint information of a user by extracting a fingerprint of the user and converting the fingerprint of the user into an electrical signal for outputting. Specifically, reference is made to FIG. 1, which is a schematic sectional view of a conventional fingerprint recognition device. The fingerprint recognition device includes a substrate 100, a fingerprint recognition chip 101 coupled to a surface of the substrate 100, and a glass substrate 102 covering a surface of the fingerprint recognition chip 101.

A capacitive fingerprint recognition chip is taken as an example. The fingerprint recognition chip 101 includes one or more capacitor plates. An epidermis or a subcutaneous layer of a finger of the user includes raised ridges and depressed valleys, and distances between the ridges and the fingerprint recognition chip 101 are different from those between the valleys and the fingerprint recognition chip 101 when the finger 103 of the user touches a surface of the glass substrate 102. Therefore, capacitance values between the ridges of the finger 103 of the user and the capacitor plates are different from those between the valleys of the finger 103 of the user and the capacitor plates. The fingerprint recognition chip 101 can obtain the different capacitance values, convert the capacitance values into corresponding electrical signals and output the electrical signals. The fingerprint recognition device can obtain fingerprint information of the user after collecting the received electrical signals.

In practice, a conventional fingerprint recognition device has a high requirement on sensitivity of a fingerprint recognition chip, which limits manufacture and application of the fingerprint recognition device.

SUMMARY

A package structure and a packaging method for a fingerprint recognition chip are provided according to the present disclosure, and the package structure has a reduced requirement on sensitivity of a sensing chip and thus is more broadly applicable.

In order to solve the above problem, a package structure for a fingerprint recognition chip is provided according to the present disclosure. The package structure includes a substrate including a substrate surface. The package structure further includes a sensing chip coupled to the substrate surface. The sensing chip includes a first surface and a second surface opposite to the first surface. The first surface of the sensing chip includes a sensing region. The second surface of the sensing chip is located on the substrate surface. The package structure further includes plastic packaging layer located on the substrate surface and the first surface of the sensing chip. The plastic packaging layer covers a surface of the sensing region of the sensing chip. A surface of the plastic packaging layer located on the sensing region is flat. A part of the plastic packaging layer located on the surface of the sensing region has a pre-set thickness. The plastic packaging layer is made of a polymer.

Optionally, the pre-set thickness of the part of the plastic packaging layer located on the surface of the sensing region may range from 20 microns to 100 microns.

Optionally, a tolerance of the pre-set thickness may range from −10% to +10%.

Optionally, the plastic packaging layer may have a Mohs hardness greater than or equal to 8 H, and a dielectric constant greater than or equal to 7.

Optionally, the plastic packaging layer may be made of epoxy resin, polyimide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate copolymer or polyvinyl alcohol.

Optionally, the first surface of the sensing chip may further include a peripheral region surrounding the sensing region.

Optionally, the sensing chip may further include an edge groove located in the peripheral region. The edge groove may be exposed from a side wall of the sensing chip. The sensing chip may further include a chip circuit located on the peripheral region of the sensing chip. The chip circuit may be located on a surface of the peripheral region of the sensing chip and on a surface of a side wall and a surface of a bottom of the edge groove. A first connection terminal may be provided at the bottom of the edge groove, and the chip circuit may be connected to the first connection terminal.

Optionally, the edge groove may be a continuous groove surrounding the sensing region. Or, the edge groove may include several discrete grooves surrounding the sensing region.

Optionally, a second connection terminal may be provided on the substrate surface.

Optionally, the package structure may further include a conductive wire. Two ends of the conductive wire may be connected to the first connection terminal and the second connection terminal respectively.

Optionally, the package structure may further include a conductive layer located on a surface of the side wall of the sensing chip, on the substrate surface and in the edge groove. Two ends of the conductive layer may be connected to the first connection terminal and the second connection terminal respectively.

Optionally, the package structure may further include a first bonding layer located between the sensing chip and the substrate.

Optionally, the sensing chip may further include a conductive plug extending through the sensing chip. The conductive plug may be exposed from the second surface of the sensing chip, and one end of the conductive plug may be connected to the first connection terminal. The sensing chip may further include a solder layer located on a top of the conductive plug exposed from the second surface of the sensing chip. The solder layer may be welded to a surface of the second connection terminal.

Optionally, the package structure may further include a protective ring located on the substrate surface. The protective ring may surround the sensing chip and the plastic packaging layer.

Optionally, the protective ring may be made of a metal, and the protective ring may be grounded via the substrate.

Optionally, the package structure may further include a housing surrounding the plastic packaging layer, the sensing chip and the protective ring. The plastic packaging layer located on the surface of the sensing region may be exposed from the housing, and a colour of the plastic packaging layer may be identical with that of the housing.

Optionally, the package structure may further include a housing surrounding the plastic packaging layer and the sensing chip. The plastic packaging layer located on the surface of the sensing region may be exposed from the housing, and the colour of the plastic packaging layer may be identical with that of the housing.

Optionally, the substrate may be a rigid substrate or a flexible substrate, and an end of the substrate may include a connection portion configured to electrically connect the sensing chip to an external circuit.

Accordingly, a packaging method for forming any of the structures described above is provided according to the present disclosure. The method includes providing a substrate. The substrate includes a substrate surface. The method further includes coupling a sensing chip to the substrate surface. The sensing chip includes a first surface and a second surface opposite to the first surface. The first surface of the sensing chip includes a sensing region. The second surface of the sensing chip is located on the substrate surface. The method further includes forming a plastic packaging layer on the substrate surface and the first surface of the sensing chip. The plastic packaging layer covers a surface of the sensing region of the sensing chip. A surface of the plastic packaging layer formed on the sensing region is flat. A part of the plastic packaging layer located on the surface of the sensing region has a pre-set thickness.

Optionally, a process for forming the plastic packaging layer may include an injection molding process, a transfer molding process or a screen printing process.

Compared with the conventional technology, the technical solutions in the present disclosure have the following advantages.

In the package structure according to the present disclosure, the second surface of the sensing chip is coupled to the substrate surface, the first surface of the sensing chip includes the sensing region, and the sensing region is configured to extract the fingerprint of the user. The plastic packaging layer located on the substrate surface and the first surface of the sensing chip covers the surface of the sensing region of the sensing chip. The plastic packaging layer located on the surface of the sensing region can protect the sensing region. The sensing region can extract the fingerprint of the user when a finger of the user is put on the surface of the plastic packaging layer located in the sensing region, and the sensing chip can convert the fingerprint of the user into an electrical signal and output the electrical signal. The plastic packaging layer is made of the polymer. The polymer has good ductility, good flexibility, and high performance in covering, and thus the plastic packaging layer has a small thickness, and a high hardness enough to protect the sensing chip. In addition, a distance between the surface of the plastic packaging layer and the sensing chip is reduced, which makes it easy for the sensing chip to detect the fingerprint of the user. Accordingly, the package structure has a reduced requirement on sensitivity of the sensing chip, and the package structure for the fingerprint recognition chip is thus more broadly applicable.

Moreover, since the plastic packaging layer is made of the polymer, cost of manufacturing the package structure is reduced by protecting the sensing region with the plastic packaging layer. The plastic packaging layer is located on the substrate surface and surfaces of other parts of the surface of the sensing chip than the sensing region. The plastic packaging layer is configured to package the sensing chip and fix the sensing chip to the substrate surface. The plastic packaging layer can also protect the sensing region, and is configured to be touched by the finger of the user directly. Therefore, the package structure for the fingerprint recognition chip is simple.

Furthermore, the pre-set thickness of the part of the plastic packaging layer located on the surface of the sensing region ranges from 20 microns to 100 microns, and the plastic packaging layer has a Mohs hardness greater than or equal to 8 H. The hardness of the plastic packaging layer is high enough to protect the sensing region from being damaged, although the thickness of the plastic packaging layer located on the surface of the sensing region is small. In addition, it is easier for the sensing region to detect the fingerprint of the user touching the surface of the plastic packaging layer, which lowers the requirement on the sensitivity of the sensing chip.

The plastic packaging layer has a dielectric constant greater than or equal to 7. Since the dielectric constant of the plastic packaging layer is large, the plastic packaging layer has a great electrical isolation capacity, and thus the plastic packaging layer has a great capacity to protect the sensing region. Although the thickness of the plastic packaging layer located on the surface of the sensing region is small, capacitance values between the finger of the user and the sensing region are within a range which is detectable.

Furthermore, the protective ring is also provided on the substrate surface, and the protective ring surrounds the sensing chip and the plastic packaging layer. The protective ring is configured to provide electrostatic protection for the sensing chip, to avoid a decrease in accuracy of fingerprint data of the user detected by the sensing region or to eliminate signal noise outputted by the sensing chip, thereby ensuring that the data is detected by the sensing chip and a signal is outputted by the sensing chip more accurately.

In the packaging method according to the present disclosure, the first surface of the sensing chip includes the sensing region configured to extract a fingerprint of a user, and the plastic packaging layer is formed on the substrate surface and the surface of the sensing chip, and covers the surface of the sensing region. The plastic packaging layer is configured to protect the sensing region of the sensing chip. Fingerprint detection can be performed when a finger of the user is put on the surface of the plastic packaging layer located on the sensing region. The plastic packaging layer is configured to package the sensing chip, and fix the sensing chip on the substrate surface. The plastic packaging layer is made of the polymer. The polymer has good ductility, good flexibility, and high performance in covering, and thus the plastic packaging layer formed on the surface of the sensing region has a small thickness, and a high hardness enough to protect the sensing chip. In addition, a distance between the surface of the plastic packaging layer and the sensing chip is reduced, which makes it easy for the sensing region to obtain fingerprint data of the user. The formed package structure has a reduced requirement on sensitivity of the sensing chip, and the package method thus is more broadly applicable. Moreover, since the plastic packaging layer protects the sensing region as well packages the sensing chip, the process for packaging the sensing chip is simplified. Further, since the plastic packaging layer is made of the polymer, the plastic packaging layer has a reduced cost, which reduces the cost for manufacturing the package structure.

DETAILED DESCRIPTION OF THE EMBODIMENTS

As described in the background, a conventional fingerprint recognition device has a high requirement on sensitivity of a fingerprint recognition chip, and is limited in its manufacture and application.

Figure 1:
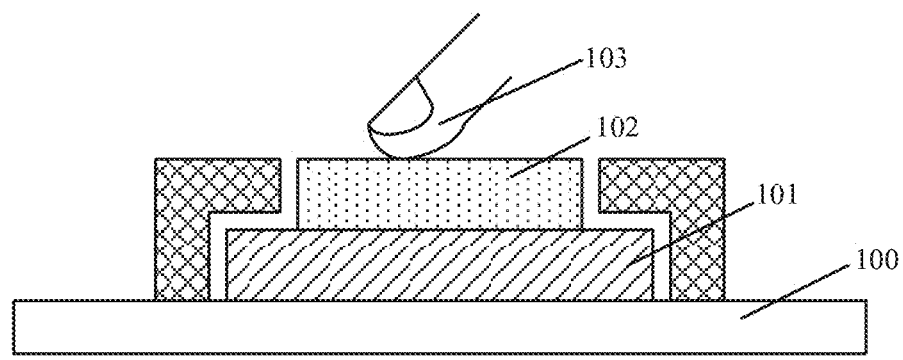
FIG. 1 is a schematic sectional view of a conventional fingerprint recognition device.

Reference is made to FIG. 1. A surface of a fingerprint recognition chip 101 is covered with a glass substrate 102. The glass substrate 102 is configured to protect the fingerprint recognition chip 101. Since a finger 103 of a user will touch the glass substrate 102 directly, a thickness of the glass substrate 102 is made large so as to ensure the glass substrate 102 to have sufficient protection capability. In practice, since the thickness of the glass substrate 102 is large, the fingerprint recognition chip 101 is required to have a high sensitivity to ensure accurate extracting of a fingerprint of the user. A fingerprint recognition chip with high sensitivity is difficult to manufacture and has a high manufacture cost, and is thus limited in its manufacture and application.

Specifically, a capacitive fingerprint recognition device is taken as an example. When the finger 103 of the user is put on a surface of the glass substrate 102, a capacitor is formed between the finger 103 of the user and a capacitor plate in the fingerprint recognition chip 101. The finger 103 of the user and the capacitor plate are two electrodes of the capacitor, and the glass substrate 102 is a dielectric between the two electrodes of the capacitor. Since the thickness of the glass substrate 102 is large, a capacitance value between the finger 103 of the user and the capacitor plate is large. A height difference between a ridge and a valley of the finger 103 of the user is small, and hence, a difference between a capacitance value between the ridge and the capacitor plate and a capacitance value between the valley and the capacitor plate is very small. In order to accurately detect the difference between the capacitance values, the fingerprint recognition chip 101 is required to have a high sensitivity.

In order to solve the above problem, a package structure and a packaging method for a fingerprint recognition chip are provided according to the present disclosure. In the package structure, a surface of a sensing region of a sensing chip is covered with a plastic packaging layer. The plastic packaging layer on the surface of the sensing region, which is provided for replacing the conventional glass substrate, can be touched by a finger of a user directly, and is configured to protect the sensing chip. The plastic packaging layer is made of a polymer. The polymer has good ductility and good flexibility, and thus the plastic packaging layer has a small thickness, and a high hardness enough to protect the sensing chip. In addition, a distance between a surface of the plastic packaging layer and the sensing chip is reduced, which makes it easier for the sensing chip to detect the fingerprint of the user. Accordingly, the package structure has a reduced requirement on sensitivity of the sensing chip, and the package structure for the fingerprint recognition chip is thus more broadly applicable.

For a better understanding of the object, features and advantages of the present disclosure, embodiments of the present disclosure are described in detail hereinafter in conjunction with drawings.

FIG. 2 to FIG. 6 are schematic diagrams of a package structure for a fingerprint recognition chip according to embodiments of the present disclosure.

Figure 2:
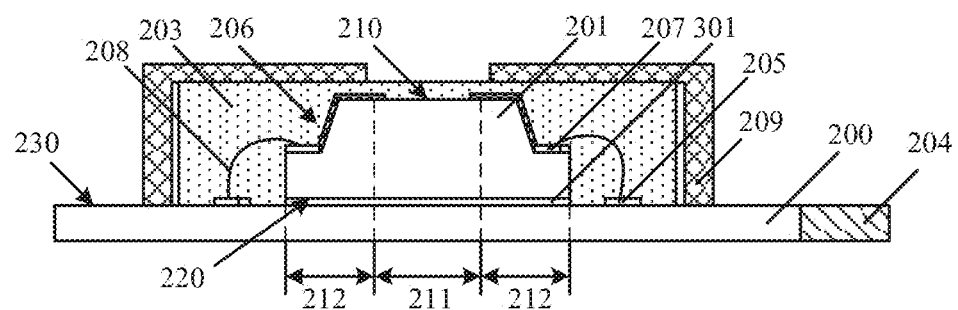
FIG. 2 is a schematic diagram of a package structure for a fingerprint recognition chip according to a preferred embodiment of the present disclosure.

Reference is made to FIG. 2. The package structure for the fingerprint recognition chip includes a substrate 200, a sensing chip 201 and a plastic packaging layer 203.

The substrate 200 includes a substrate surface.

The sensing chip 201 is coupled to the substrate surface. The sensing chip 201 includes a first surface 210 and a second surface 220 opposite to the first surface 210. The first surface 210 of the sensing chip 201 includes a sensing region 211. The second surface 220 of the sensing chip 201 is located on the substrate surface.

The plastic packaging layer 203 is located on the substrate surface and the first surface 210 of the sensing chip 201. The plastic packaging layer 203 covers a surface of the sensing region 211 of the sensing chip 201. A surface of the plastic packaging layer 203 located on the sensing region 211 is flat. A part of the plastic packaging layer 203 located on the surface of the sensing region 211 has a pre-set thickness. The plastic packaging layer 203 is made of a polymer.

The package structure for the fingerprint recognition chip is described in detail hereinafter.

The substrate 200 is configured to fix the sensing chip 201, and electrically connect the sensing chip 201 to other devices or circuits. The substrate 200 is a rigid substrate or a flexible substrate, depending on a device or a terminal in which the sensing chip 201 is to be arranged. In the embodiment, the substrate 200 is a rigid substrate. The rigid substrate is a PCB substrate, a glass substrate, a metal substrate, a semiconductor substrate or a polymer substrate.

The substrate 200 includes a substrate surface 230. The sensing chip 201 is coupled to the substrate surface 230 of the substrate 200. A wiring layer (not shown) is provided on the substrate surface 230 of the substrate 200, and the wiring layer is connected to a second connection terminal 205 located on the substrate surface 230 of the substrate 200. The second connection terminal 205 is configured to be connected to a chip circuit on the surface of the sensing chip 201.

In the embodiment, an end of the substrate 200 includes a connection portion 204. The connection portion 204 may be made of a conductive material. The connection portion 204 is electrically connected to the wiring layer, so that the chip circuit may be electrically connected to an external circuit or device via the wiring layer on the substrate surface 230 of the substrate 200 and the connection portion 204 to achieve transmission of an electrical signal.

The sensing region 211 located on the first surface 210 of the sensing chip 201 is configured to detect and receive fingerprint information of a user. A capacitor structure or an inductor structure may be provided in the sensing region 211, and the capacitor structure or the inductor structure may be configured to obtain the fingerprint information of the user.

In the embodiment, at least one capacitor plate is provided in the sensing region 211. When a finger of the user is put on the surface of the plastic packaging layer 203 located on the sensing region 211, a capacitor structure is formed by the capacitor plate, the plastic packaging layer 203 and the finger of the user. The sensing region 211 may obtain a difference between a capacitance value between a ridge on a surface of the finger of the user and the capacitor plate and a capacitance value between a valley on the surface of the finger of the user and the capacitor plate, process the difference between the capacitance values via the chip circuit, and output the difference between the capacitance values, to obtain fingerprint data of the user.

The first surface 210 of the sensing chip 201 further includes a peripheral region 212 surrounding the sensing region 211. A chip circuit (not shown) is provided on the peripheral region 212 of the first surface 210 of the sensing chip 201. The chip circuit is electrically connected to the capacitor structure or the inductor structure in the sensing region 211, and is configured to process an electrical signal outputted by the capacitor structure or the inductor structure.

The sensing chip 201 further includes an edge groove 206 located in the peripheral region 212. The edge groove 206 is exposed from a side wall of the sensing chip 201. The chip circuit located on the peripheral region 212 of the sensing chip 201 is located on a surface of a side wall and a surface of a bottom of the edge groove 206. A first connection terminal 207 is provided at the bottom of the edge groove 206. The chip circuit extends into the edge groove 206, and is connected to the first connection terminal 207.

The edge groove 206 is configured to form an output terminal of the chip circuit, i.e., the first connection terminal 207. By electrically connecting the first connection terminal 207 and the second connection terminal 205 on the substrate surface of the substrate 200, the sensing chip 201 is coupled with the substrate 200.

In an embodiment, the edge groove 206 is a continuous groove surrounding the sensing region 211. One or more first connection terminals 207 are provided on the surface of the bottom of the continuous edge groove 206. In another embodiment, the edge groove 206 includes several discrete grooves surrounding the sensing region 211. One or more first connection terminals 207 are provided in each of the discrete grooves 206. The number and distribution of the first connection terminals 207 are determined based on a specific circuit layout requirement of the chip circuit.

In the embodiment, the side wall of the edge groove 206 is inclined with respect to the surface of the sensing chip 201. An angle between the side wall and the bottom of the edge groove 206 is an obtuse angle. The surface of the inclined side wall of the edge groove 206 makes it easy to form the chip circuit and the circuit layout between the sensing region 211 and the first connection terminal 207.

The plastic packaging layer 203 is located on the substrate surface of the substrate 200 and surrounds the sensing chip 201. The plastic packaging layer 203 is configured to fix the sensing chip on the substrate surface of the substrate 200, and is configured to protect and isolate the sensing chip 201. In addition, the plastic packaging layer 203 is located on the surface of the sensing region 211 of the sensing chip 201 to protect the sensing region 211. The plastic packaging layer 203 on the surface of the sensing region 211 can be touched by the finger of the user directly. The plastic packaging layer 203 can protect and fix the sensing chip 201, protect the sensing region 211 of the sensing chip 201, and can be touched by the finger of the user directly. Therefore, the package structure for the fingerprint recognition chip according to the embodiment is simple, and manufacture cost is reduced.

The plastic packaging layer 203 is made of a polymer. The polymer material has good ductility, and good flexibility, and high performance in covering. As a result, the plastic packaging layer 203 located on the surface of the sensing region 211 has a small thickness, thereby improving capacity of the sensing chip 201 for sensing a fingerprint of the user. In addition, by selecting and adjusting a type of the polymer material, the plastic packaging layer 203 located on the surface of the sensing region 211 can have a high hardness, thereby ensuring that the plastic packaging layer 203 has sufficient capacity to protect the sensing region 211.

The plastic packaging layer 203 located on the surface of the sensing region 211 has a pre-set thickness ranging from 20 microns to 100 microns. The pre-set thickness is small. When the finger of the use is put on the surface of the plastic packaging layer 203 on the sensing region 211, a distance between the finger and the sensing region 211 is small. Therefore, the sensing region 211 can detect the fingerprint of the user more easily, lowering a requirement on sensitivity of the sensing chip 201.

In addition, a tolerance of the pre-set thickness ranges from −10% to +10%, so as to ensure the thickness of the plastic packaging layer 203 located on the surface of the sensing region 211 to be uniform. In this way, an accurate detection result for the fingerprint of the user is ensured.

In the embodiment, the capacitor plate is provided in the sensing region 211. Since the thickness of the plastic packaging layer 203 located on the surface of the sensing region 211 is small, a distance between the finger of the user and the capacitor plate is short when the finger of the user is put on the surface of the plastic packaging layer 203 on the sensing region 211. Hence, the capacitance values between the finger of the user and the capacitor plate are small. Accordingly, the difference between the capacitance value between the ridge (raised) on the surface of the finger of the user and the capacitor plate and the capacitance value between the valley (depressed) and the capacitor plate is large, and therefore, the sensing region 211 can detect the fingerprint information of the user easily.

In addition, the range of the pre-set thickness ranges from −10% to +10%, so that the thickness of the plastic packaging layer 203 located on the surface of the sensing region 211 is uniform. In this way, in detecting the fingerprint information of the user, deviations in the capacitance values between the finger of the user and the capacitor plate due to a variation of the thickness of the plastic packaging layer 203 can be prevented, and therefore, detection result of the fingerprint of the user is more accurate.

The plastic packaging layer 203 has a Mohs hardness greater than or equal to 8 H. The hardness of the plastic packaging layer 203 is high. Therefore, even though the thickness of the plastic packaging layer 203 located on the surface of the sensing region 211 is small, the plastic packaging layer 203 still can protect the sensing region 211 of the sensing chip 201, and the sensing chip 201 will not be damaged when the finger of the user is moving on the surface of the plastic packaging layer 203 on the sensing region 211. In addition, since the hardness of the plastic packaging layer 203 is high, deformation is unlikely to occur at the plastic packaging layer 203. Even if the finger of the user presses the surface of the plastic packaging layer 203, the thickness of the plastic packaging layer 203 is unlikely to change, and hence, accuracy of detection result of the sensing region 211 is ensured.

The plastic packaging layer 203 has a dielectric constant greater than or equal to 7. Electrical isolation capacity of the plastic packaging layer 203 is great. Hence, the plastic packaging layer 203 located on the surface of the sensing region 211 has great capacity of protecting the sensing region 211.

In the embodiment, the thickness of the plastic packaging layer 203 located on the surface of the sensing region 211 is small, and the capacitance values between the finger of the user and the capacitor plate are inversely proportional to the thickness of the plastic packaging layer 203, and are directly proportional to the dielectric constant of the plastic packaging layer 203. Therefore, if the thickness of the plastic packaging layer 203 is small and the dielectric constant of the plastic packaging layer 203 is large, the capacitance values between the finger of the user and the capacitor plate are within a range which is detectable by the sensing region 211, thereby avoiding detection failure of the sensing region 211 due to too large or too small capacitance values.

In addition, when the plastic packaging layer 203 on the surface of the sensing region 211 has a thickness ranging from 20 microns to 100 microns, and a dielectric constant greater than or equal to 7. The thickness of the plastic packaging layer 203 located on the surface of the sensing region 211 increases accordingly as the dielectric constant of the material of the plastic packaging layer 203 increases, so as to stabilize the capacitance values between the finger of the user and the capacitor plate within a stable range which is detectable by the sensing region 211.

The plastic packaging layer 203 is made of epoxy resin, polyimide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate copolymer, polyvinyl alcohol or other suitable polymer materials.

In the embodiment, the package for the fingerprint recognition chip further includes a conductive wire 208. Two ends of the conductive wire 208 are connected to the first connection terminal 207 and the second connection terminal 205 respectively, so as to electrically connect the chip circuit to the wiring layer on the substrate surface of the substrate 200. The wiring layer is electrically connected to the connection portion 204, so that the chip circuit on the surface of the sensing chip 201 and the sensing region 211 can transmit/receive an electrical signal to/from the external circuit or device. The conductive wire 208 is made of a metal, such as copper, tungsten, aluminum, gold or silver.

In the embodiment, as the first connection terminal 207 and the second portion 205 are connected via the conductive wire 208, the package structure for the fingerprint recognition chip further includes a first bonding layer 301 located between the sensing chip 201 and the substrate 200. The bonding layer 301 is configured to fix the sensing chip 201 on the substrate surface 230 of the substrate 200.

In the embodiment, the package structure for the fingerprint recognition chip further includes a protective ring 209 located on the substrate surface of the substrate 200. The protective ring 209 surrounds the sensing chip 20 and the plastic packaging layer 203. The protective ring 209 is made of a metal. The protective ring 209 is grounded via the substrate 200. The protective ring 209 is fixed on the first surface 230 of the substrate 200.

In the embodiment, the protective ring 209 is located around the sensing chip 201 and the plastic packaging layer 203, and covers a part of the plastic packaging layer 203, and the plastic packaging layer 203 on the surface of the sensing region 211 is exposed from the protective ring 209. In another embodiment, the protective ring is only located around the sensing chip 201 and the plastic packaging layer 203, and the surface of the plastic packaging layer 203 is exposed from the protective ring.

The protective ring 209 is made of a metal, such as copper, tungsten, aluminum, gold or silver. The protective ring 209 is configured to provide electrostatic protection for the sensing chip. Since the protective ring 209 is made of metal, the protective ring 209 is conductive. Static electricity is generated when the finger of the user touches the plastic packaging layer 203, and electrostatic charges is transferred to the substrate 200 via the protective ring 209, thereby protecting the plastic packaging layer 203 from being broken down due to a too large electrostatic voltage. In this way, the sensing chip 201 is protected, and accuracy of fingerprint detection is improved. Signal noise outputted by the sensing chip is eliminated, and thus a signal outputted by the sensing chip is more accurate.

Figure 3:
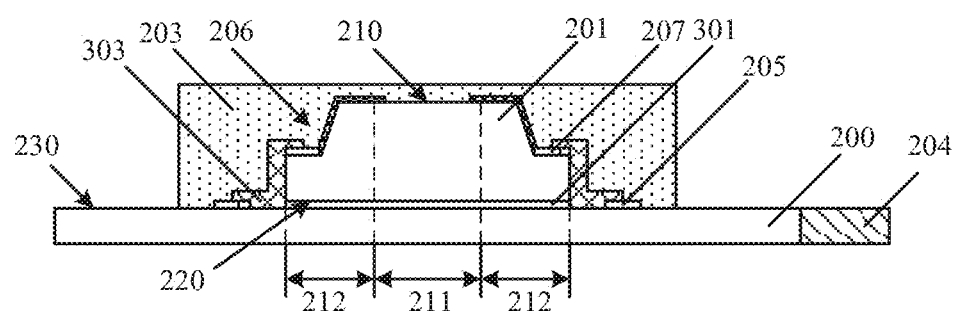
FIG. 3 is a schematic diagram of a package structure for a fingerprint recognition chip according to another preferred embodiment of the present disclosure.

In an embodiment, as shown in FIG. 3, the package structure for fingerprint recognition chip further includes a conductive layer 303 located on a surface of the side wall of the sensing chip 201, on the first surface 210 of the substrate 200 and in the edge groove 206. Two ends of the conductive layer 303 are connected to the first connection terminal 207 and the second connection terminal 205 respectively, to achieve electrical connections between the sensing region 211 and the wiring layer on the substrate surface of the substrate 200, and between the chip circuit and the wiring layer on the substrate surface of the substrate 200. The package structure for the fingerprint recognition chip further includes a first bonding layer 301 located between the sensing chip 201 and the substrate 200.

Figure 4:
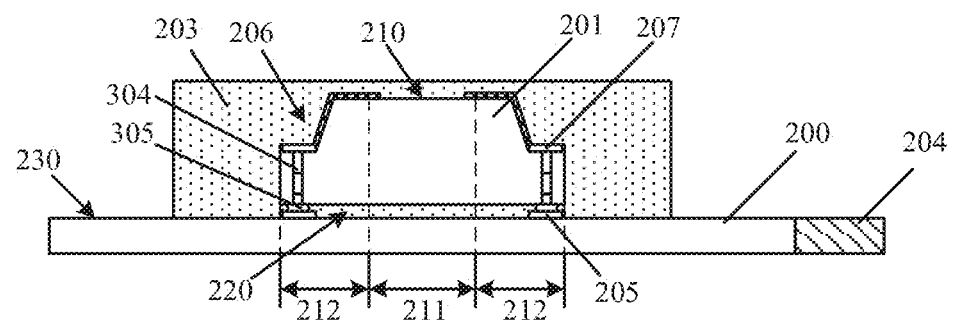
FIG. 4 is a schematic diagram of a package structure for a fingerprint recognition chip according to another preferred embodiment of the present disclosure.

In another embodiment, as shown in FIG. 4, the sensing chip 201 further includes a conductive plug 304 extending through the sensing chip 201. The conductive plug 304 is exposed from the second surface 220 of the sensing chip 201. One end of the conductive plug 304 is connected to first connection terminal 207. The sensing chip 201 further includes a solder layer 305 located on a top of the conductive plug 304 exposed from the second surface 220 of the sensing chip 201. The solder layer 305 is welded to a surface of the second connection terminal 205, to achieve electrical connections between the sensing region 211 and the wiring layer on the substrate surface of the substrate 200, and between the chip circuit and the wiring layer on the substrate surface of the substrate 200. Since the sensing chip 201 is welded to the first surface 230 of the substrate 200 via the solder layer 305, the sensing chip 201 is fixed with respect to the substrate 200.

Figure 5:
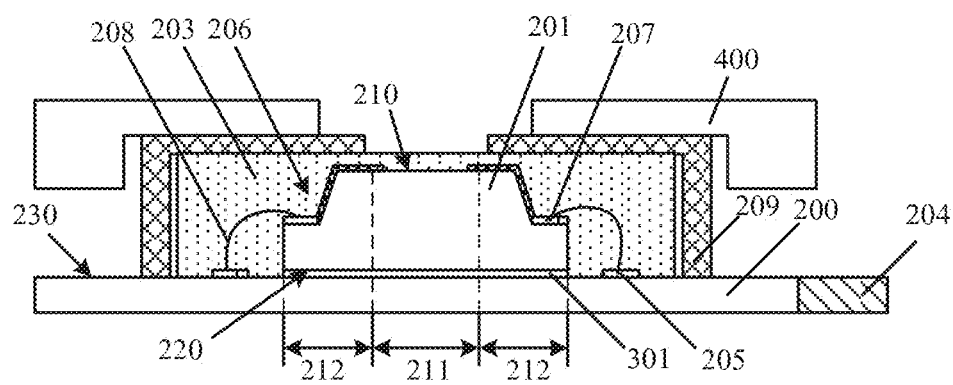
FIG. 5 is a schematic diagram of a package structure for a fingerprint recognition chip according to another preferred embodiment of the present disclosure.

In the embodiment, as shown in FIG. 5, the package structure for the fingerprint recognition chip further includes a housing 400 surrounding the plastic packaging layer 203, the sensing chip 201 and the protective ring 209. The surface of the plastic packaging layer 203 on the sensing region 211 is exposed from the housing 400, so that the plastic packaging layer 203 on the surface of the sensing region 211 can be touched by the finger of the user to achieve fingerprint detection. A colour of the plastic packaging layer 203 is identical with that of the housing 400. For example, if the housing 400 is black, the plastic packaging layer 203 is black; and if the housing 400 is white, the plastic packaging layer 203 is white. In this way, the package structure for the fingerprint recognition chip has a harmonious appearance as a whole.

Figure 6:
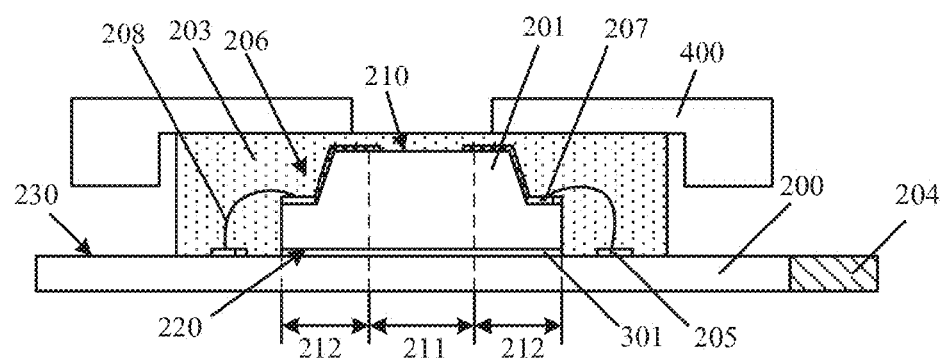
FIG. 6 is a schematic diagram of a package structure for a fingerprint recognition chip according to another preferred embodiment of the present disclosure.

In another embodiment, as shown in FIG. 6, the package structure for the fingerprint recognition chip does not include the protective ring 209 described, but includes a housing surrounding the plastic packaging layer 203 and the sensing chip 201. The plastic packaging layer 203 on the surface of the sensing region 211 is exposed from the housing 400. The colour of the plastic packaging layer 203 is identical with that of the housing 400.

In the embodiment, the second surface of the sensing chip is coupled to the substrate surface, the first surface of the sensing chip includes the sensing region, and the sensing region is configured to extract the fingerprint of the user. The plastic packaging layer is provided on the surface of the sensing region of the sensing chip, and covers the surface of the sensing region of the sensing chip. The plastic packaging layer on the surface of the sensing region is configured to protect the sensing region. The sensing region can extract the fingerprint of the user when the finger of the user is put on the surface of the plastic packaging layer on the sensing region, and the sensing chip can convert the fingerprint of the user into an electrical signal and output the electrical signal. The plastic packaging layer is made of the polymer. The polymer has good ductility, good flexibility, and high performance in covering, and thus the plastic packaging layer has a small thickness, and a high hardness enough to protect the sensing chip. In addition, a distance between the surface of the plastic packaging layer and the sensing chip is reduced, which makes it easy for the sensing chip to detect the fingerprint of the user. Accordingly, the package structure has a reduced requirement on sensitivity of the sensing chip, and the package structure for the fingerprint recognition chip is thus more broadly applicable. Moreover, since the plastic packaging layer is made of the polymer, cost of manufacturing the package structure is reduced by protecting the sensing region with the plastic packaging layer. The plastic packaging layer is located on the substrate surface and surfaces of other parts of the surface of the sensing chip than the sensing region. The plastic packaging layer is configured to package the sensing chip and fix the sensing chip to the substrate surface. The plastic packaging layer can also protect the sensing region, and is configured to be touched by the finger of the user directly. Therefore, the package structure for the fingerprint recognition chip is simple.

Correspondingly, a packaging method for forming the package structure for the fingerprint recognition chip described above is further provided according to an embodiment of the present disclosure, as shown in FIG. 7 to FIG. 10.

Figure 7:
FIG. 7 to FIG. 10 are schematic sectional views illustrating a packaging method for a fingerprint recognition chip according to embodiments of the present disclosure.

As shown in FIG. 7, a substrate 200 is provided.

The substrate 200 is a rigid substrate or a flexible substrate, depending on a device or a terminal in which a sensing chip 201 is to be arranged. In the embodiment, the substrate 200 is a rigid substrate. The rigid substrate is a PCB substrate, a glass substrate, a metal substrate, a semiconductor substrate or a polymer substrate.

The substrate 200 includes a substrate surface 230. The sensing chip formed subsequently is coupled to the substrate surface 230. A wiring layer and a second connection terminal 205 are formed on the substrate surface 230 of the substrate 200. The wiring layer is connected to the second connection terminal 205.

In the embodiment, a connection portion 204 is formed on an end of the substrate 200. The connection portion 204 may be made of a conductive material. The wiring layer is connected to the connection portion 204, so that the wiring layer and the second connection terminal 205 may be electrically connected to an external circuit or device.

Figure 8:
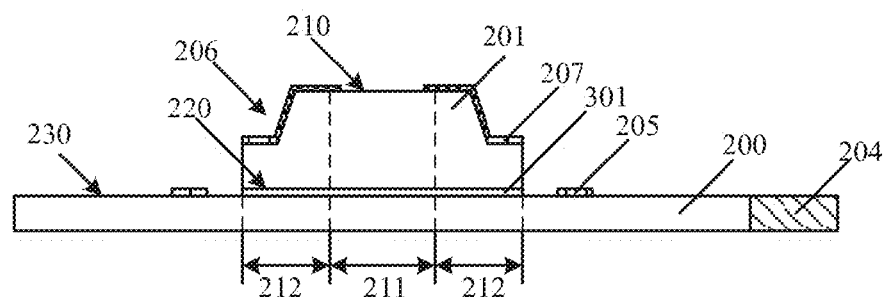

As shown in FIG. 8, the sensing chip 201 is fixed on the substrate surface 230 of the substrate 200. The sensing chip 201 includes a first surface 210 and a second surface 220 opposite to the first surface 210. The first surface 210 of the sensing chip 201 includes a sensing region 211. The second surface 220 of the sensing chip 201 is located on the substrate surface of the substrate 200.

The sensing chip 201 is configured to recognize a fingerprint of a user. The sensing region 211 of the sensing chip 201 is configured for sensing the fingerprint information of the user. A capacitor structure or an inductor structure may be provided in the sensing region 211, and the capacitor structure or the inductor structure may be configured to obtain the fingerprint information of the user, and convert the fingerprint information into an electrical signal for outputting.

In the embodiment, at least one capacitor plate is formed in the sensing region 211. When a finger of the user is put on a surface of the plastic packaging layer 203 on the sensing region 211, a capacitor structure is formed by the capacitor plate, the plastic packaging layer 203 and the finger of the user. The sensing region 211 may obtain a difference between a capacitance value between a ridge on a surface of the finger of the user and the capacitor plate and a capacitance value between a valley on the surface of the finger of the user and the capacitor plate, process the difference between the capacitance values via a chip circuit, and output the difference between the capacitance values, to obtain fingerprint data of the user.

The sensing chip 201 further includes a peripheral region 212 surrounding the sensing region 211. An edge groove 206 is formed in the peripheral region 212 of the sensing chip 201. The groove 206 is exposed from a side wall of the sensing chip 201. A first connection terminal 207 is formed at a bottom of the groove 206. A chip circuit is formed on the first surface 210 of the sensing chip 201. The chip circuit extends into the groove 206, and is connected to the first connection terminal 207. The first connection terminal 207 is an output terminal of the chip circuit.

In an embodiment, the edge groove 206 is a continuous groove surrounding the sensing region 211. One or more first connection terminals 207 are formed on a surface of the bottom of the continuous edge groove 206. In another embodiment, the edge groove 206 includes several discrete grooves surrounding the sensing region 211. One or more first connection terminals 207 are formed in each of the discrete edge grooves 206.

In the embodiment, a side wall of the edge groove 206 is inclined with respect to the surface of the sensing chip 201. An angle between the side wall and the bottom of the edge groove 206 is an obtuse angle. When forming the chip circuit in the edge groove 206, it is easy to perform photolithography and etching processes on material of the chip circuit formed on the surface of the inclined side wall, to form layout of the chip circuit.

In the embodiment, the sensing chip 201 is fixed on the substrate surface 230 of the substrate 200 via a first bonding layer 301. Subsequently, the first connection terminal 207 is connected to the second connection terminal 205 via a conductive wire or a conductive layer.

In another embodiment, as shown in FIG. 4, a conductive plug 304 extending through the sensing chip 201 is formed in the sensing chip 201. The conductive plug 304 is exposed from the second surface 220 of the sensing chip 201. One end of the conductive plug 304 is connected to first connection terminal 207. A solder layer 305 is formed on a top of the conductive plug 304 exposed from the second surface 220 of the sensing chip 201. The solder layer 305 is welded to a surface of the second connection terminal 205, to fix the sensing chip 201 and the substrate 200 with respect to each other.

Figure 9:
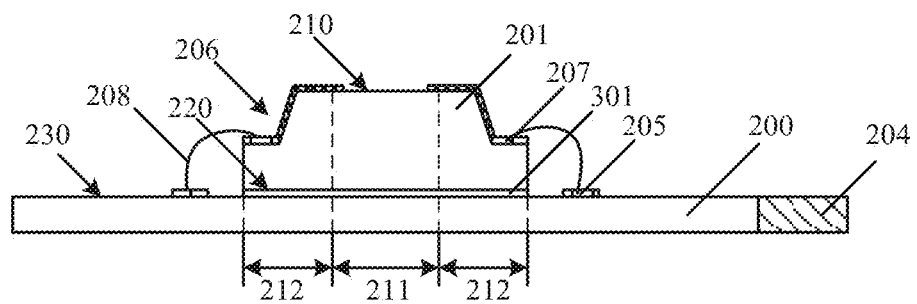

As shown in FIG. 9, after the sensing chip 201 is fixed on the substrate surface 230 of the substrate 200, the substrate 200 is coupled to the sensing chip 201.

In the embodiment, the sensing chip 201 is fixed on the substrate surface of the substrate 200 via a first adhesive layer 301, and the substrate 200 may be coupled to the sensing chip 201 via a conductive wire or a conductive layer.

In the embodiment, a process for coupling the sensing chip 201 to the substrate surface of the substrate 200 includes providing a conductive wire 208, and connecting two ends of the conductive wire 208 to the first connection terminal 207 and the second connection terminal 205 respectively through a welding process. The conductive wire 208 is made of a metal, such as copper, tungsten, aluminum, gold or silver.

In another embodiment, as shown in FIG. 3, a process for coupling the sensing chip 201 to the substrate surface of the substrate 200 includes forming a conductive layer 303 on the surface of the side wall of the sensing chip 201, on the substrate surface 230 of the substrate 200 and in the edge groove 206. Two ends of the conductive layer 303 are connected to the first connection terminal 207 and the second connection terminal 205 respectively. A process for forming the conductive layer 303 includes forming a conductive film through a deposition process, a plating process or a chemical plating process, and etching a part of the conductive film to form the conductive layer 303. The conductive layer 303 is made of a metal, such as copper, tungsten, aluminum, silver, gold, titanium, tantalum, nickel, titanium nitride, tantalum nitride or any combination thereof.

Figure 10:
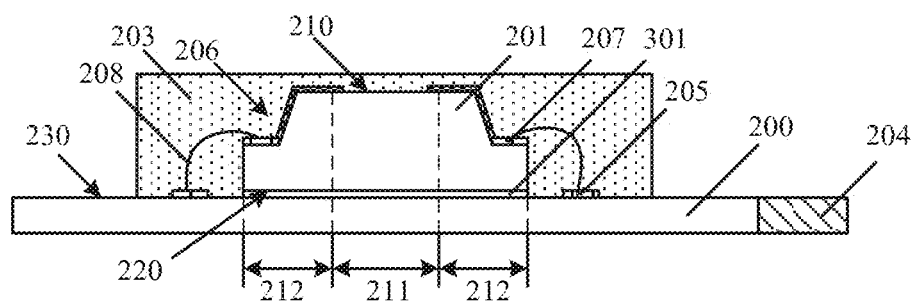

As shown in FIG. 10, a plastic packaging layer 203 is formed on the substrate surface 230 of the substrate 200 and the first surface 210 of the sensing chip 201. The plastic packaging layer 203 covers the surface of the sensing region 211 of the sensing chip 201. The surface of the plastic packaging layer 203 located on the sensing region 211 is flat. A part of the plastic packaging layer 203 located on the surface of the sensing region 211 has a pre-set thickness The plastic packaging layer 203 may be made of epoxy resin, polyimide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate copolymer, polyvinyl alcohol or other suitable polymer materials.

A process for forming the plastic packaging layer 203 may be an injection molding process, a transfer molding process or a screen printing process. The plastic packaging layer may also be formed through other suitable processes. The plastic packaging layer 203 is formed on the substrate surface of the substrate 200. The plastic packaging layer surrounds the sensing chip 201 and covers the surface of the sensing region 211. The plastic packaging layer 203 is configured to fix the sensing chip on the substrate surface of the substrate 200, and is configured to protect and isolate the sensing chip 201. In addition, the plastic packaging layer 203 can protect the sensing region 211. The plastic packaging layer 203 on the surface of the sensing region 211 can be touched by the finger of the user directly. Therefore, the package structure for the fingerprint recognition chip according to the embodiment is simple, and process time and manufacture cost can be reduced.

The part of the plastic packaging layer 203 formed on the surface of the sensing region 211 has a pre-set thickness ranging from 20 microns to 100 microns. The pre-set thickness is small. When the finger of the use is put on the surface of the plastic packaging layer 203 on the sensing region 211, a distance between the finger and the sensing region 211 is small. Therefore, the sensing region 211 can detect the fingerprint of the user more easily, lowering a requirement on sensitivity of the sensing chip 201. In addition, a tolerance of the pre-set thickness ranges from −10% to +10%, so as to ensure the thickness of the plastic packaging layer 203 located on the surface of the sensing region 211 to be uniform. In this way, an accurate detection result for the fingerprint of the user is ensured.

The plastic packaging layer 203 has a Mohs hardness greater than or equal to 8 H. The hardness of the plastic packaging layer 203 is high. Therefore, even though the thickness of the plastic packaging layer 203 located on the surface of the sensing region 211 is small, the plastic packaging layer 203 still can protect the sensing region 211 of the sensing chip 201, and the sensing chip 201 will not be damaged when the finger of the user is moving on the surface of the plastic packaging layer 203 on the sensing region 211.

The plastic packaging layer 203 has a dielectric constant greater than or equal to 7. Electrical isolation capacity of the plastic packaging layer 203 is great. Hence, the plastic packaging layer 203 located on the surface of the sensing region 211 has great capacity of protecting the sensing region 211.

In the embodiment, after the plastic packaging layer 203 is formed, a protective ring 209 is formed on the substrate surface of the substrate 200. The protective ring 209 surrounds the sensing chip 201 and the plastic packaging layer 203. The protective ring 209 is made of a metal. The protective ring 209 is grounded via the substrate 200. The protective ring 209 is made of a metal, such as copper, tungsten, aluminum, gold or silver.

In the embodiment, the plastic packaging layer formed on the substrate surface of the substrate and the surface of the sensing chip is configured to package the sensing chip. The plastic packaging layer is made of the polymer, and the polymer material has good ductility, and good flexibility, and high performance in covering, and thus the plastic packaging layer formed on the surface of the sensing region has a small thickness, and a high hardness enough to protect the sensing chip. In addition, a distance between the surface of the plastic packaging layer and the sensing chip is reduced, which makes it easy for the sensing region to obtain fingerprint data of the user. As a result, the formed package structure has a reduced requirement on sensitivity of the sensing chip, and the package method is thus more broadly applicable. Moreover, since the plastic packaging layer can protect the sensing region as well package the sensing chip, the packaging method for the sensing chip is simplified.

Although the present disclosure is disclosed by the above descriptions, the invention is not limited thereto. Various changes and modifications can be made by those skilled without departing from the spirit and scope of the present disclosure. Therefore, the scope of the present disclosure is defined by the claims.

The invention claimed is:

1. A package structure for a fingerprint recognition chip, comprising:
a substrate comprising a substrate surface;
a sensing chip coupled to the substrate surface, wherein the sensing chip comprises a first surface and a second surface opposite to the first surface, the first surface of the sensing chip comprises a sensing region, and the second surface of the sensing chip is located on the substrate surface; and
a plastic packaging layer located on the substrate surface and the first surface of the sensing chip, wherein the plastic packaging layer covers a surface of the sensing region of the sensing chip, a surface of the plastic packaging layer located on the sensing region is flat, a part of the plastic packaging layer located on the surface of the sensing region has a pre-set thickness, and the plastic packaging layer is made of a polymer;
wherein the first surface of the sensing chip comprises a peripheral region surrounding the sensing region;
wherein the sensing chip comprises:
an edge groove located in the peripheral region, wherein the edge groove is exposed from a side wall of the sensing chip; and
a chip circuit located on the peripheral region of the sensing chip, wherein the chip circuit is located on a surface of the peripheral region of the sensing chip and on a surface of a side wall and a surface of a bottom of the edge groove, a first connection terminal is provided at the bottom of the edge groove, and the chip circuit is connected to the first connection terminal.

2. The package structure for the fingerprint recognition chip according to claim 1, wherein the pre-set thickness of the part of the plastic packaging layer located on the surface of the sensing region ranges from 20 microns to 100 microns.

3. The package structure for the fingerprint recognition chip according to claim 2, wherein a tolerance of the pre-set thickness ranges from −10% to +10%.

4. The package structure for the fingerprint recognition chip according to claim 1, wherein the plastic packaging layer has a Mohs hardness greater than or equal to 8H, and a dielectric constant greater than or equal to 7.

5. The package structure for the fingerprint recognition chip according to claim 4, wherein the plastic packaging layer is made of epoxy resin, polyimide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate copolymer or polyvinyl alcohol.

6. The package structure for the fingerprint recognition chip according to claim 1, wherein
the edge groove is a continuous groove surrounding the sensing region; or
the edge groove comprises a plurality of discrete grooves surrounding the sensing region.

7. The package structure for the fingerprint recognition chip according to claim 1, wherein a second connection terminal is provided on the substrate surface.

8. The package structure for the fingerprint recognition chip according to claim 7, further comprising a conductive wire, wherein two ends of the conductive wire are connected to the first connection terminal and the second connection terminal respectively.

9. The package structure for the fingerprint recognition chip according to claim 7, further comprising a conductive layer located on a surface of the side wall of the sensing chip, on the substrate surface and in the edge groove, wherein two ends of the conductive layer are connected to the first connection terminal and the second connection terminal respectively.

10. The package structure for the fingerprint recognition chip according to claim 8, further comprising a first bonding layer located between the sensing chip and the substrate.

11. The package structure for the fingerprint recognition chip according to claim 7, wherein the sensing chip further comprises:
a conductive plug extending through the sensing chip, wherein the conductive plug is exposed from the second surface of the sensing chip, and one end of the conductive plug is connected to the first connection terminal; and
a solder layer located on a top of the conductive plug exposed from the second surface of the sensing chip, wherein the solder layer is welded to a surface of the second connection terminal.

12. The package structure for the fingerprint recognition chip according to claim 1, further comprising a protective ring located on the substrate surface, wherein the protective ring surrounds the sensing chip and the plastic packaging layer.

13. The package structure for the fingerprint recognition chip according to claim 12, wherein the protective ring is made of a metal, and the protective ring is grounded via the substrate.

14. The package structure for the fingerprint recognition chip according to claim 12, further comprising a housing surrounding the plastic packaging layer, the sensing chip and the protective ring, wherein the plastic packaging layer located on the surface of the sensing region is exposed from the housing, and a colour of the plastic packaging layer is identical with that of the housing.

15. The package structure for the fingerprint recognition chip according to claim 1, further comprising a housing surrounding the plastic packaging layer and the sensing chip, wherein the plastic packaging layer located on the surface of the sensing region is exposed from the housing, and a colour of the plastic packaging layer is identical with that of the housing.

16. The package structure for the fingerprint recognition chip according to claim 1, wherein the substrate is a rigid substrate or a flexible substrate, and an end of the substrate comprises a connection portion configured to electrically connect the sensing chip to an external circuit.

17. A packaging method for a fingerprint recognition chip, comprising:

provding a substrate, wherein the substrate comprises a substrate surface;

coupling a sensing chip to the substrate surface, wherein the sensing chip comprises a first surface and a second surface opposite to the first surface, the first surface of the sensing chip comprises a sensing region, and the second surface of the sensing chip is located on the substrate surface; wherein the first surface of the sensing chip comprises a peripheral region surrounding the sensing region;

forming an edge groove in the peripheral region, wherein the edge groove is exposed from a side wall of the sensing chip;

forming a chip circuit on a surface of the peripheral region of the sensing chip and on a surface of a side wall and a surface of a bottom of the edge groove;

forming a first connection terminal 207 at the bottom of the groove, wherein the chip circuit is connected to the first connection terminal; and forming a plastic packaging layer on the substrate surface and the first surface of the sensing chip, wherein the plastic packaging layer covers a surface of the sensing region of the sensing chip, a surface of the plastic packaging layer formed on the sensing region is flat, and a part of the plastic packaging layer located on the surface of the sensing region has a pre-set thickness.

18. The packaging method for the fingerprint recognition chip according to claim 17, wherein a process for forming the plastic packaging layer comprises an injection molding process, a transfer molding process or a screen printing process.

19. The package structure for the fingerprint recognition chip according to claim 9, further comprising a first bonding layer located between the sensing chip and the substrate.

* * * * *